(12) United States Patent
Tseng

(10) Patent No.: US 9,054,639 B2
(45) Date of Patent: Jun. 9, 2015

(54) FREQUENCY DIVIDING SYSTEM AND INPUT LEVEL TRIGGERING DEVICE

(71) Applicant: MEDIATEK INC., Hsin-Chu (TW)

(72) Inventor: Sheng-Che Tseng, New Taipei (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/470,909

(22) Filed: Aug. 27, 2014

(65) Prior Publication Data

US 2015/0061733 A1    Mar. 5, 2015

Related U.S. Application Data

(60) Provisional application No. 61/872,773, filed on Sep. 2, 2013.

(51) Int. Cl.
*H03K 3/00* (2006.01)
*H03B 19/14* (2006.01)

(52) U.S. Cl.
CPC .................................... *H03B 19/14* (2013.01)

(58) Field of Classification Search
USPC .................................................. 327/117, 118
See application file for complete search history.

(56) References Cited

U.S. PATENT DOCUMENTS

| | | | |
|---|---|---|---|
| 7,113,009 B2 | 9/2006 | Sun | |
| 7,492,852 B1 * | 2/2009 | Liu | ................................ 377/48 |
| 8,049,546 B2 | 11/2011 | Oh | |

* cited by examiner

*Primary Examiner* — Daniel Rojas
(74) *Attorney, Agent, or Firm* — Winston Hsu; Scott Margo

(57) ABSTRACT

A frequency dividing system, which comprises a control circuit, a first multiple input sharing input level triggering device, a first input level triggering group and a second input level triggering group. The first multiple input sharing input level triggering device receives a first frequency dividing signal to generate a feedback signal according to a level of a first clock signal, or receives a second frequency dividing signal to generate the feedback signal according to a level of a second clock signal. The first/second input level triggering group generates the first/second frequency dividing signal to the first multiple input sharing input level triggering device according to the feedback signal if active; and outputs a fixed voltage to the first multiple input sharing input level triggering device if non-active.

17 Claims, 12 Drawing Sheets

US 9,054,639 B2

FREQUENCY DIVIDING SYSTEM AND INPUT LEVEL TRIGGERING DEVICE

CROSS REFERENCE TO RELATED APPLICATIONS

This application claims the priority of U.S. Provisional Application No. 61/872,773, filed Sep. 2, 2013, which is included herein by reference.

BACKGROUND

The present application relates to an input level triggering device and a frequency dividing system, and particularly relates to an input level triggering device which can operate as a multiplexer and a frequency dividing system comprising the input level triggering device. FIG. 1 is a block diagram illustrating a conventional frequency dividing system. As shown in FIG. 1, the input level triggering devices D_1, D_2, D_3, D_4 are coupled in series. At least two input level triggering devices can form a frequency dividing device, the frequency dividing ratios of the frequency dividing depend on the numbers of input level triggering devices. In this example, two input level triggering devices constitute a frequency dividing device. Therefore, frequency dividing signals FDS_1, and FDS_2 with different frequencies can be provided. The multiplexer M is applied to select one of the frequency dividing signals FDS_1, and FDS_2 to output.

The output terminal of the multiplexer M can serve as a frequency divider output signal FDO, and serves as an input signal INS transmitted back to the input level triggering devices D_1.

The frequency dividing signals can be generated by an even number of input level triggering devices, as shown in FIG. 1. The frequency dividing signals can be generated by an odd number of input level triggering devices as well.

However, such frequency dividing system may have large loading since a plurality of multiplexers are needed and a plurality of devices are coupled in series in such structure. One extra multiplexer also degrades phase noise performance and consumes more current.

SUMMARY

Therefore, one objective of the present application is to provide a frequency dividing system comprising an input level triggering device that can operate as a multiplexer.

Another objective of the present application is to provide an input level triggering device that can operate as a multiplexer.

One embodiment of the present application discloses a frequency dividing system, which comprises a control circuit, a first multiple input sharing input level triggering device, a first input level triggering group and a second first input level triggering group. The first multiple input sharing input level triggering device comprises a first input terminal, a second input terminal, a first clock terminal and a second clock terminal, wherein the first multiple input sharing input level triggering device receives a first frequency dividing signal at the first input terminal to generate a feedback signal according to a level of a first clock signal received at the first clock terminal, or receives a second frequency dividing signal at the second input terminal to generate the feedback signal according to a level of a second clock signal received at the second clock terminal. The first input level triggering group comprises at least one input level triggering device, for generating the first frequency dividing signal to the first multiple input sharing input level triggering device according to the feedback signal if the first input level triggering group is controlled by the control circuit to be active signal; and for outputting a fixed voltage to the first multiple input sharing input level triggering device if the first input level triggering group is controlled by the control circuit to be non-active. The second input level triggering group comprising at least one input level triggering device; for generating the second frequency dividing signal to the first multiple input sharing input level triggering device according to the feedback signal if the second input level triggering group is controlled by the control circuit to be active signal; and for outputting a fixed voltage to the first multiple input sharing input level triggering device if the second input level triggering group is controlled by the control circuit to be non-active. The first input level triggering group cooperates with the first multiple input sharing input level triggering device to provide a first frequency dividing ratio, and the second input level triggering group cooperates with the first multiple input sharing input level triggering device to provide a second frequency dividing ratio.

Another embodiment of the present application discloses a multiple input sharing input level triggering device, which comprises: a latching circuit; a first receiving circuit, for receiving a first input signal and a first clock signal; a second receiving circuit, for receiving a second input signal and a second clock signal. The latch circuit generates an output signal according to the first input signal and a level the first clock signal, or generates the output signal according to the second input signal and a level of the second clock signal.

In view of above-mentioned embodiments, the frequency dividing system can share at least one multiple input sharing input level triggering device and the multiple input sharing input level triggering device can operate as a multiplexer. By this way, the multiplexer in related art can be omitted and the circuit region can be omitted. More, power consumption is less and overall noise performance is better.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
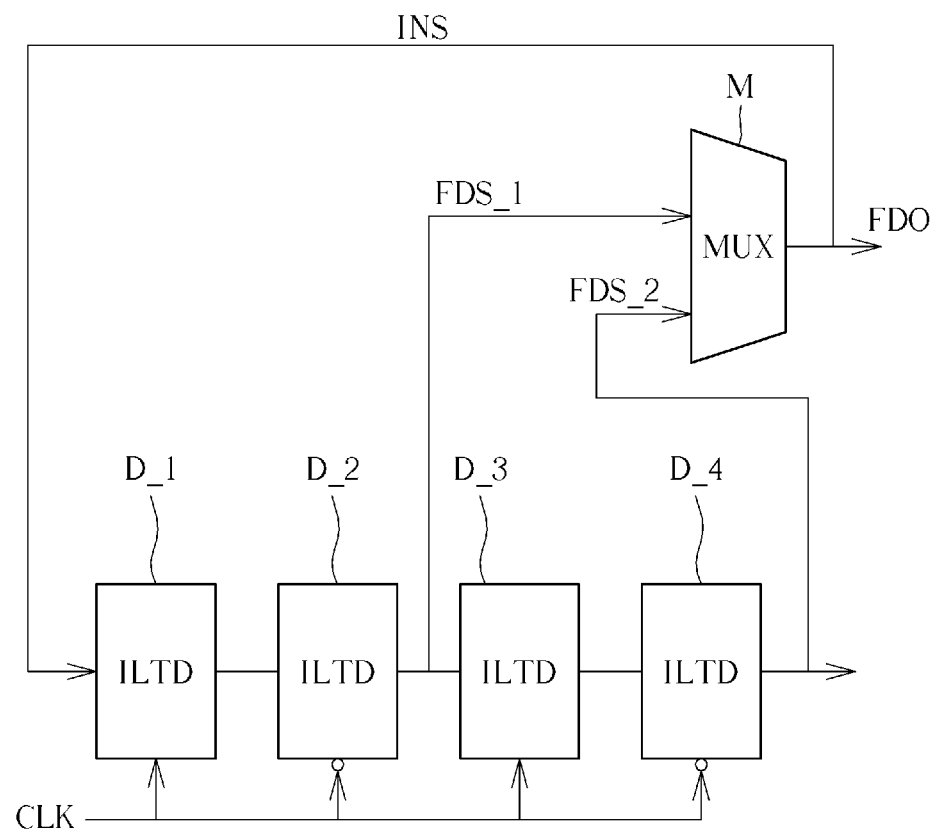
FIG. 1 is a block diagram illustrating a conventional frequency dividing system.
Figure 2:
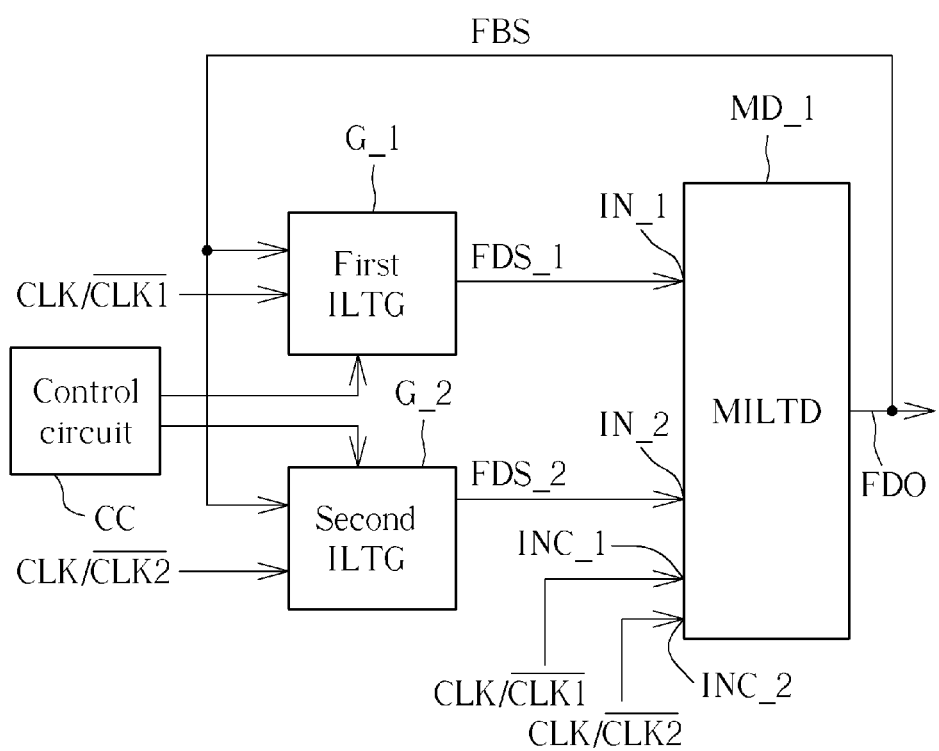
FIG. 2 is a block diagram illustrating a frequency dividing system according to one embodiment of the present application.

FIG. 2 is a block diagram illustrating a frequency dividing system according to one embodiment of the present application. As shown in FIG. 2, the frequency dividing system 200 comprises a control circuit CC, a first multiple input sharing input level triggering device MD_1, a first input level triggering group G_1, and a second input level triggering group G_2. The first multiple input sharing input level triggering device MD_1 comprises a first input terminal IN_1, a second input terminal IN_2, a first clock terminal INC_1 and a second clock terminal INC_2. The first multiple input sharing input level triggering device MD_1 receives a first frequency dividing signal FDS_1 at the first input terminal IN_1 to generate a feedback signal FBS according to a level of the clock signal CLK1 (or $\overline{CLK1}$) received at the first clock terminal INC_1, or receives a second frequency dividing signal FDS_2 at the second input terminal IN_2 to generate the feedback signal FBS according to a level of the clock signal CLK2 (or $\overline{CLK2}$) received at the second clock terminal INC_2. The feedback signal FBS can serve as input for the first input level triggering group G_1 or the second input level triggering group G_2, and can serve as a frequency divider output signal FDO for the whole system as well.

The first input level triggering group G_1 comprises at least one input level triggering device, generates a first frequency dividing signal FDS_1 to the first input terminal IN_1 according to the feedback signal FBS if the first input level triggering group G_1 is controlled by the control circuit CC to be active.

If the first input level triggering group G_1 is controlled by the control circuit CC to be non-active, the first input level triggering group G_1 outputs a fixed voltage to the first multiple input sharing input level triggering device MD_1. By this way, the first multiple input sharing input level triggering device MD_1 does not change the output thereof according to the level of the clock signal CLK1 (or $\overline{CLK1}$). That is, the first input level triggering group G_1 does not activate the first multiple input sharing input level triggering device MD_1.

The second input level triggering group G_2 comprises at least one input level triggering device, generates a second frequency dividing signal FDS_2 to the second input terminal IN_2 according to the feedback signal FBS if the second input level triggering group G_2 is controlled by the control circuit CC to be active.

If the second input level triggering group G_2 is controlled by the control circuit CC to be non-active, the second input level triggering group G_2 outputs a fixed voltage to the first multiple input sharing input level triggering device MD_1. By this way, the first multiple input sharing input level triggering device MD_1 does not change the output thereof according to the level of the clock signal CLK2 (or $\overline{CLK2}$). That is, the second input level triggering group G_2 does not activate the first multiple input sharing input level triggering device MD_1.

The frequency dividing ratio is related with the total number of the input level triggering devices in the path. For more detail, if the first input level triggering group G_1 is active, the frequency dividing ratio is related with the number of the multiple input sharing input level triggering devices, and the number of the input level triggering devices in the first input level triggering group G_1. Similarly, if the second input level triggering group G_2 is active, the frequency dividing ratio is related with the number of the multiple input sharing input level triggering devices, and the number of the input level triggering devices in the second input level triggering group G_2. Via the block diagrams illustrated in FIG. 2, a desired frequency divider output signal FDO can be acquired. In one embodiment, the first input level triggering group G_1 and the second input level triggering group G_2 are not active simultaneously.

The first input level triggering group G_1 and the second input level triggering group G_2 can have the same number of input level triggering devices thus form the same frequency dividing ratios cooperating with the first multiple input sharing input level triggering device MD_1. On the opposite, the first input level triggering group G_1 and the second input level triggering group G_2 can have different number of input level triggering devices thus form different frequency dividing ratios cooperating with the first multiple input sharing input level triggering device MD_1.

Figure 3:
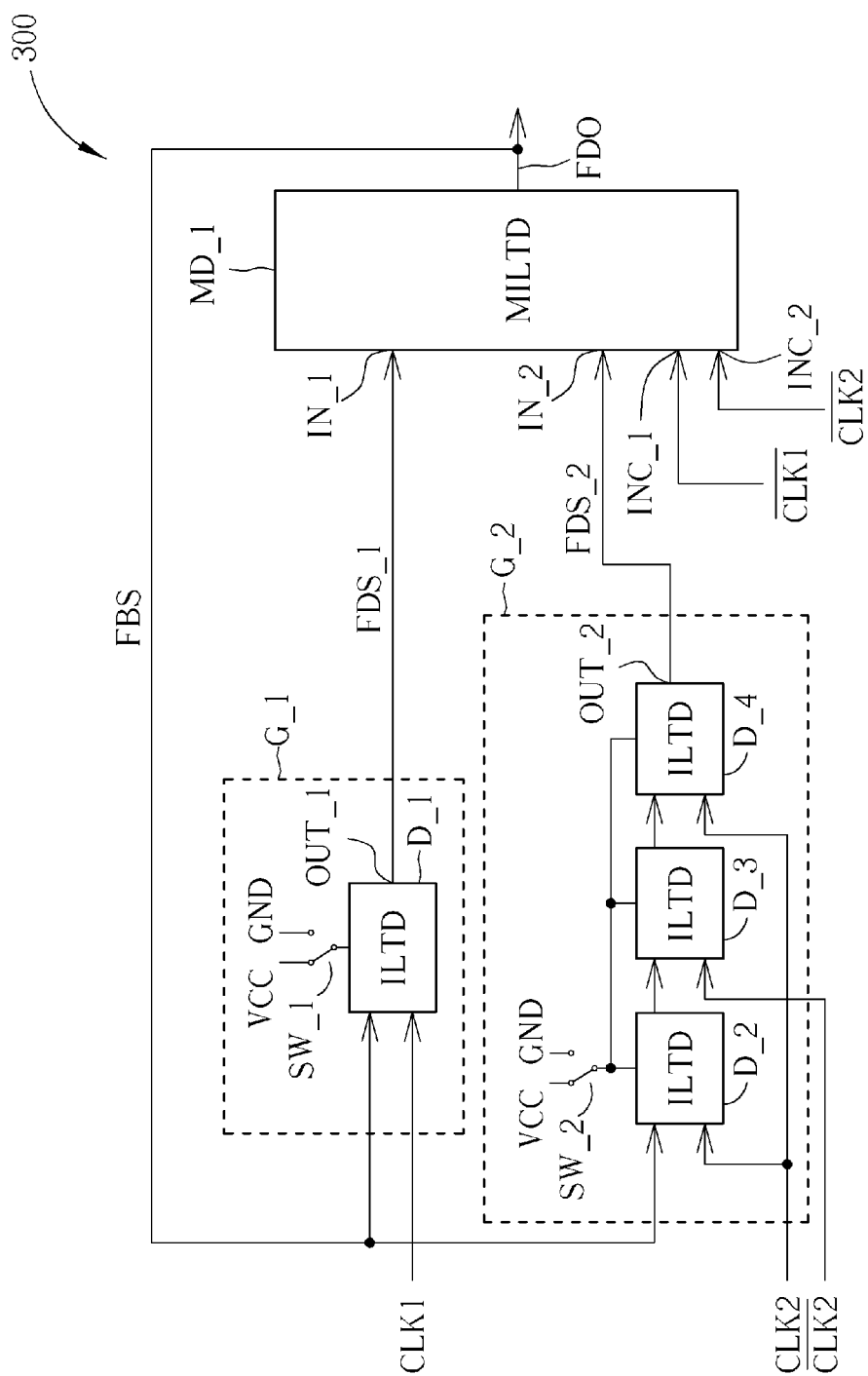
FIG. 3 is a circuit diagram illustrating a detail structure for the frequency dividing system according to one embodiment of the present application.

FIG. 3 is a circuit diagram illustrating a detail structure for the frequency dividing system according to one embodiment of the present application. Please note the control circuit CC in FIG. 2 is omitted here for the convenience of illustration. As shown in FIG. 3, the first input level triggering group G_1 comprises one input level triggering device D_1, and the second input level triggering group G_2 comprises three input level triggering devices D_2, D_3, and D_4. Therefore, the first input level triggering group G_1 and the second input level triggering group G_2 can respectively cooperate with the first multiple input sharing input level triggering device MD_1 to provide different frequency dividing ratios to generate the feedback signal FBS with different frequencies. However, please note the numbers for each input level triggering group are not limited to the embodiment shown in FIG. 3.

In the embodiment illustrated in FIG. 3, the output terminal OUT_1 outputs the first frequency dividing signal FDS_1 to the first multiple input sharing input level triggering device MD_1 if the first input level triggering group G_1 is active. If the first input level triggering group G_1 is non-active, the terminal OUT_1 keeps at a fixed voltage such that the first input level triggering group G_1 does not activate the first multiple input sharing input level triggering device MD_1. Please note the output terminal OUT_1 here is illustrated as a single terminal, however, the output terminal OUT_1 can indicate two output terminals if the first frequency dividing signal FDS_1 is a differential signal.

Similarly, the output terminal OUT_2 of the second input level triggering group G_2 outputs the second frequency dividing signal FDS_2 to the first multiple input sharing input level triggering device MD_1 if the second input level triggering group G_2 is active. If the second input level triggering group G_2 is non-active, the output terminal OUT_2 keeps at a fixed voltage such that the second input level triggering group G_2 does not activate the first multiple input sharing input level triggering device MD_1. Please note the output terminal OUT_2 here is illustrated as a single terminal, however, the output terminal OUT_2 can indicate two output terminals if the second frequency dividing signal FDS_2 is a differential signal.

Moreover, in the embodiment illustrated in FIG. 3, the first input level triggering group G_1 and the second input level triggering group G_2 respectively comprise a first switch SW_1 and a second switch SW_2. In one embodiment, the receiving transistors in the multiple input sharing input level triggering device MD_1, which are applied to receive the output from the first input level triggering group G_1 and the second input level triggering group G_2, are NMOSFETs. In such case, the first switch SW_1 and the second switch SW_2 are coupled to supply terminals of the input level triggering devices for the first input level triggering group G_1 and the second input level triggering group G_2. If the first input level triggering group G_1 is desired to be active and the second input level triggering group G_2 is desired to be non-active, the first switch SW_1 is controlled by the control circuit CC in FIG. 2 to be coupled to a predetermined voltage VCC and the second switch SW_2 is controlled by the control circuit CC to be coupled to the ground level GND, such that the input level triggering devices of the first input level triggering group G_1 is coupled to the predetermined voltage level VCC which is an operation voltage for the input level triggering devices. On the contrary, if the second input level triggering group G_2 is desired to be active and the first input level triggering group G_1 is desired to be non-active, the first switch SW_1 is controlled by the control circuit CC in FIG. 2 to be coupled to the ground voltage level GND and the second switch SW_2 is controlled by the control circuit CC to be coupled to the predetermined voltage VCC, such that the input level triggering devices of the second input level triggering group G_2 is coupled to the first predetermined voltage level VCC which is an operation voltage for the input level triggering devices.

In another embodiment, the receiving transistors in the first multiple input sharing input level triggering device MD_1, which are applied to receive the output from the first input level triggering group G_1 and the second input level triggering group G_2, are PMOSFETs. In such case, the first switch SW_1 and the second switch SW_2 are coupled to ground ports of the input level triggering devices for the first input level triggering group G_1 and the second input level triggering group G_2. In such case, the operations for the first switch SW_1 and the second switch SW_2 are opposite to the case that the receiving transistors are NMOSFETs, and are omitted for brevity here.

Please note the above-mentioned switches can be included in the control circuit CC. Also, the switches can be replaced by other structures to perform the same function. Accordingly, in view of above-mentioned description, the operations for first input level triggering group G_1 and the second input level triggering group G_2 can be summarized as follows: if the first input level triggering group is active and the second input level triggering group is non-active, the input level triggering devices in the first input level triggering group is controlled by the control circuit to couple to a first predetermined voltage level and the input level triggering devices in the second input level triggering group is controlled by the control circuit to couple to a second predetermined voltage level via the second switch; if the first input level triggering group is non-active and the second input level triggering group is active, the input level triggering devices in the first input level triggering group is controlled by the control circuit to couple to the second predetermined voltage level and the input level triggering devices in the second input level triggering group is controlled by the control circuit to couple to the first predetermined voltage level via the second switch.

Figure 9:
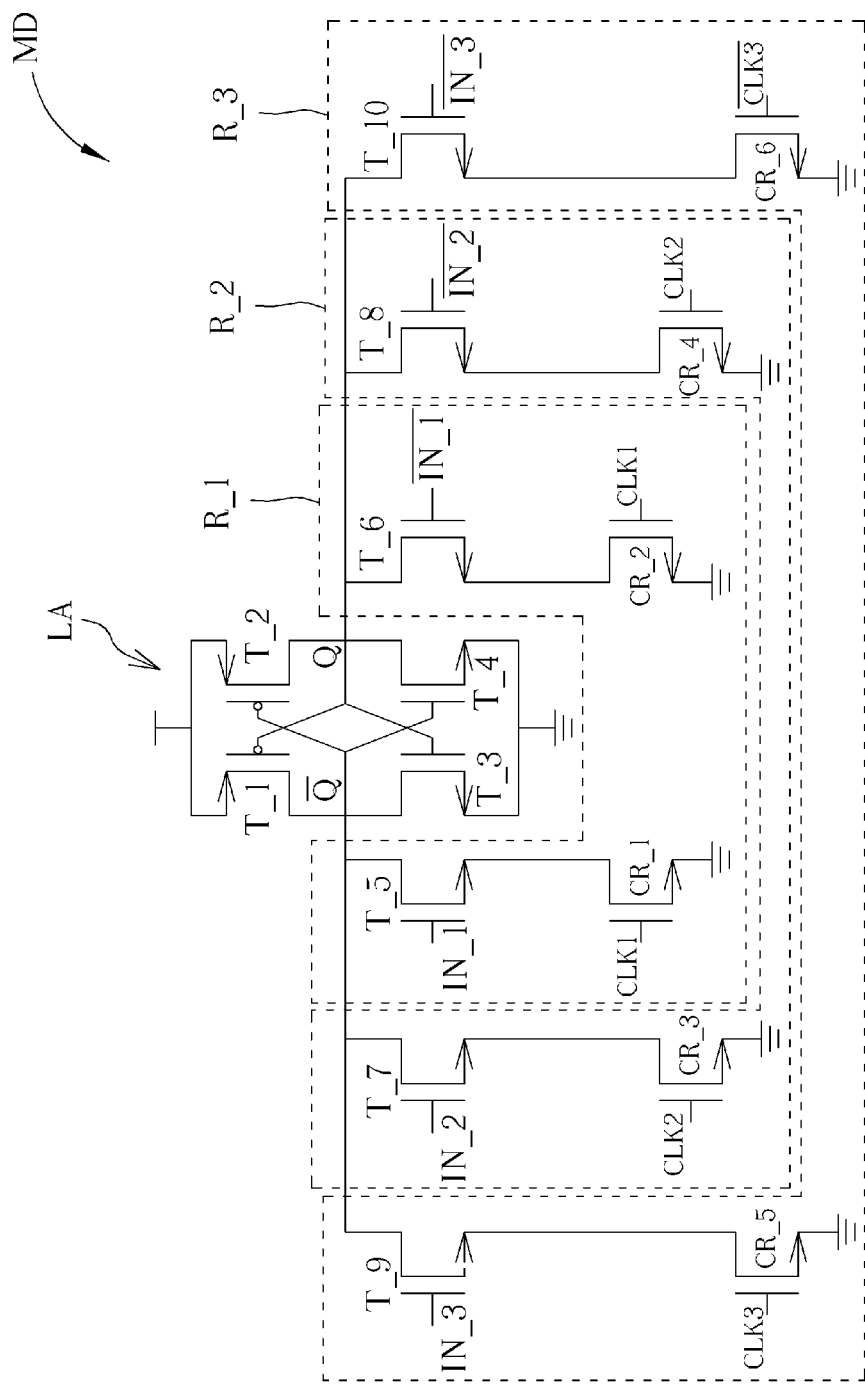
FIG. 9 and FIG. 10 are circuit diagrams illustrating a detail structure for the multiple input sharing input level triggering device according to embodiments of the present application.
Figure 10:
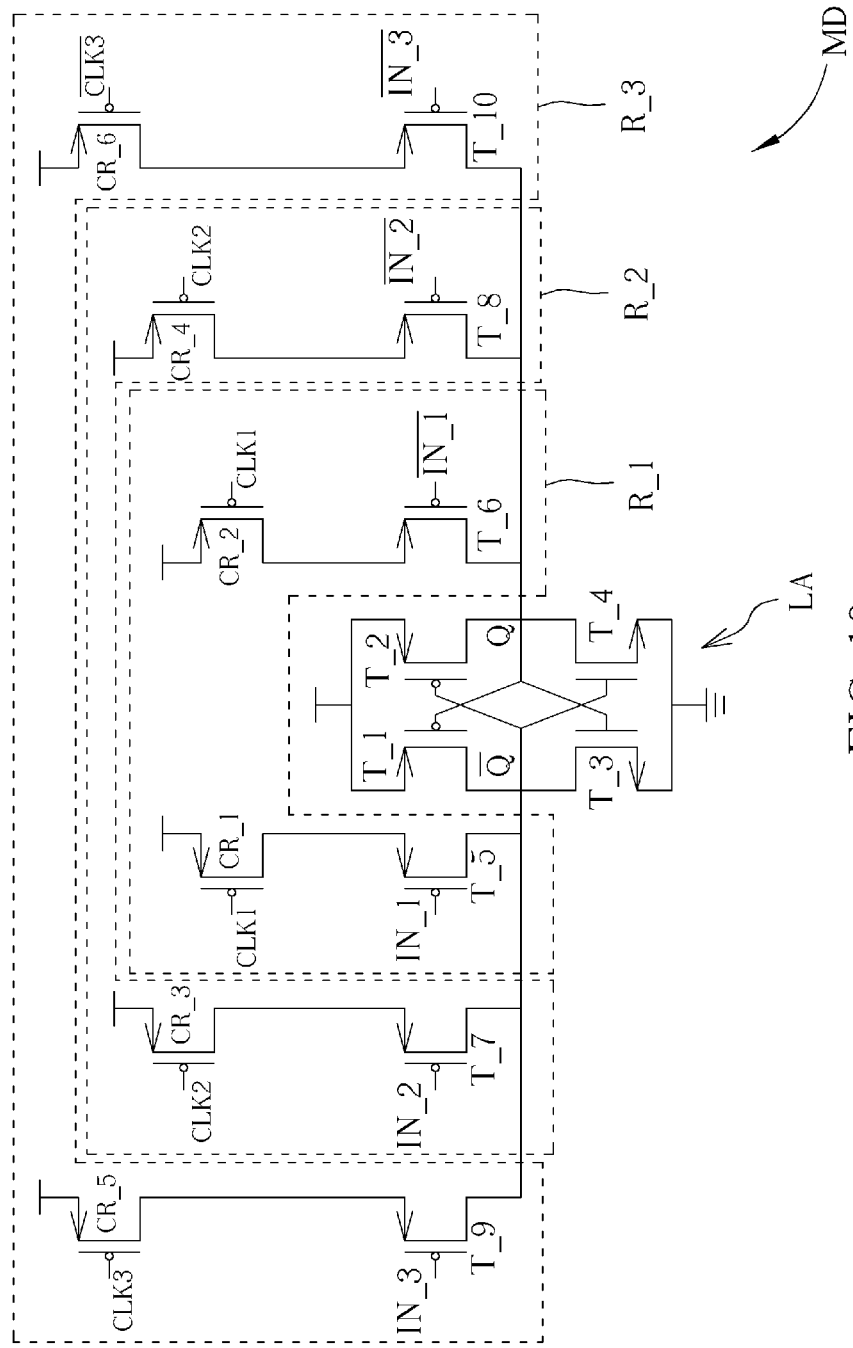

Details for the receiving transistors are depicted in FIG. 9 and FIG. 10.

By this way, output terminals OUT_1 or OUT_2 will output a ground voltage when the first input level triggering group G_1 or the second input level triggering group G_2 is non-active, such that current leakage for the input level triggering devices can be avoided. Via this structure, the latch in the first multiple input sharing input level triggering device MD_1 is not affected by the frequency dividing signal FDS_1, or FDS_2 if the first input level triggering group G_1 or the second input level triggering group G_2 is non-active.

Also, in FIG. 3 the first input level triggering group G_1 and the first multiple input sharing input level triggering device MD_1 form a frequency dividing path having a frequency dividing ratio 2, and the second input level triggering group G_1 and the first multiple input sharing input level triggering device MD_1 form a frequency dividing path having a frequency dividing ratio 4.

Figure 4:
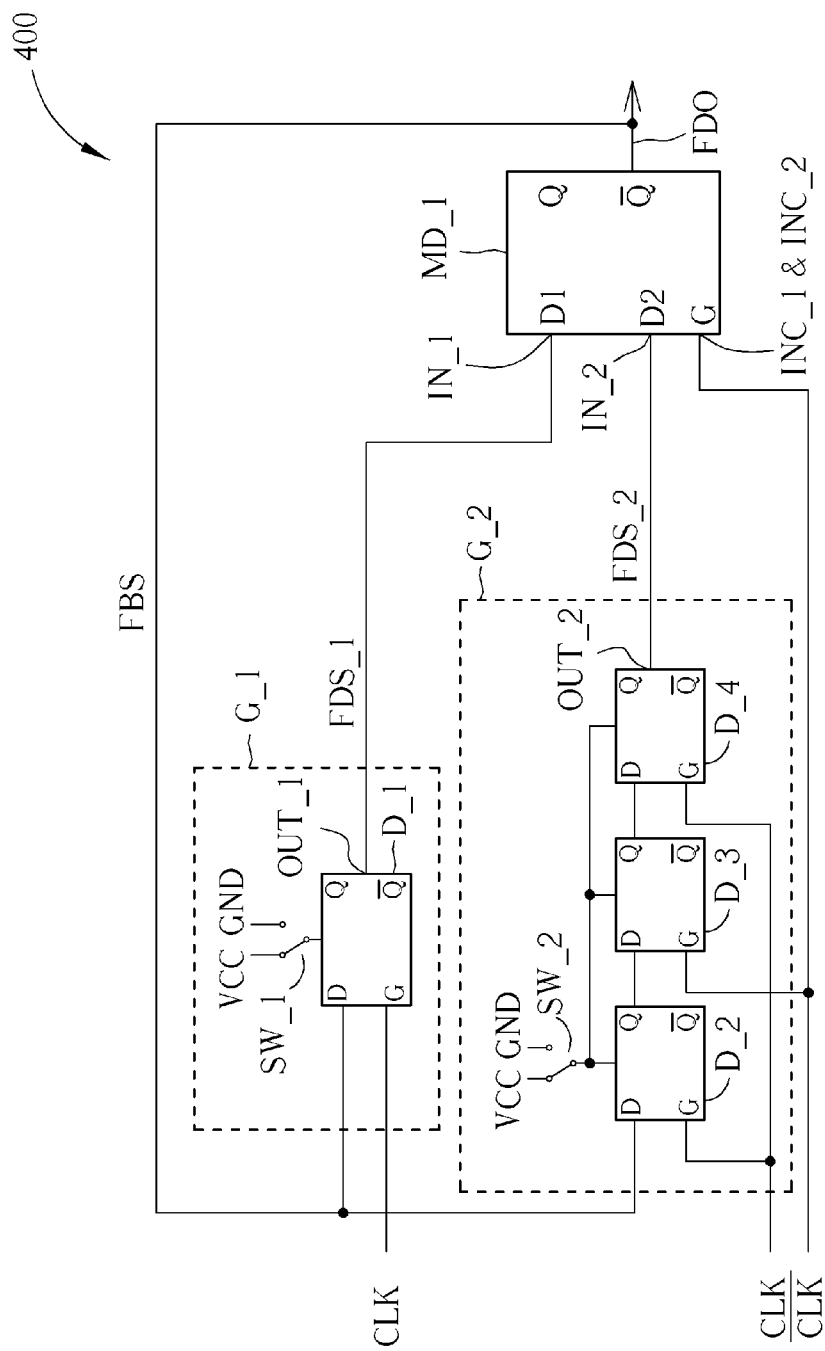
FIG. 4 is a more detail circuit diagram for the embodiment illustrated in FIG. 3.

FIG. 4 is a more detail circuit diagram for the embodiment illustrated in FIG. 3. Please note some symbols and signals are not illustrated in FIG. 4 for the convenience of illustration. In the example of FIG. 4, the input level triggering devices D_1, D_2, D_3, D_4 are input level triggering devices having a single D terminal and a single clock terminal G, and the first multiple input sharing input level triggering device MD_1 has multiple D terminals D_1, D_2 (i.e. the first input terminal IN_1 and the second input terminal IN_2) and a clock terminals G (but also can have multiple clock terminals). In such example, a $\overline{Q}$ terminal of the first multiple input sharing input level triggering device MD_1 outputs the feedback signal FBS to the first input level triggering group G_1 or the second input level triggering group G_2. The D terminal of the input level triggering devices D_1 and D_2 respectively receive the feedback signal FBS.

The input level triggering device can have different truth tables corresponding to the number of the input level triggering devices in a complete path (i.e. the first multiple input sharing input level triggering device MD_1 plus the first input level triggering group G_1 or the second input level triggering group G_2). If the number of the input level triggering devices in a complete path is even, the input level triggering device can have a truth table T1, which means the output of Q is triggered by the same clock level. On the contrary, if the number of the input level triggering devices in a complete path is odd, the input level triggering device can have a truth table T2, which means the output of Q is triggered by different clock levels. Also, in one embodiment the inputs for the input level triggering devices and the multiple input level triggering device (i.e. MD_1) are differential signals.

| T1 | | |
| --- | --- | --- |
| D | CLK | Q |
| 0 | 0 | Hold |
| 0 | 1 | 0 |
| 1 | 0 | Hold |
| 1 | 1 | 1 |

| T2 | | |
| --- | --- | --- |
| D | CLK | Q |
| 0 | 0 | 0 |
| 0 | 1 | Hold |
| 1 | 0 | Hold |
| 1 | 1 | 1 |

For the first input level triggering group G_1 and the second input level triggering group G_2, a Q terminal of the input level triggering device is coupled to a D terminal of a next input level triggering device (ex. a Q terminal of the input level triggering device D_2 is coupled to a D terminal of the input level triggering device D_3), except the final input level triggering device. For the final input level triggering device (ex. D_4 of the second input level triggering group G_2 or D_1 of the first input level triggering group G_1), the Q terminal outputs the frequency dividing signals (FDS_1, FDS_2). Additionally, the clock signal $\overline{CLK}$ (i.e. the clock signal $\overline{CLK2}$ in FIG. 2) is applied to the first multiple input sharing input level triggering device MD_1 and the input level triggering device D_3 for triggering. An inversed clock signal CLK, which has an inverted phase of the clock signal $\overline{CLK}$, are applied to the input level triggering devices D_2, D_4 for triggering. The input level triggering device D_1 receives the clock signal CLK. Please note the first multiple input sharing input level triggering device MD_1 comprises only one clock receiving terminal G in FIG. 4, thus the first input level triggering group G_1 and the second input level triggering group G_2 are coupled to the same clock source.

However, please note the connections between the input level triggering devices and the signals transmitted to each device may change if different kinds of devices are applied as the input level triggering devices or the first multiple input sharing input level triggering device. Such variation should also fall in the scope of the present application.

Figure 5A:
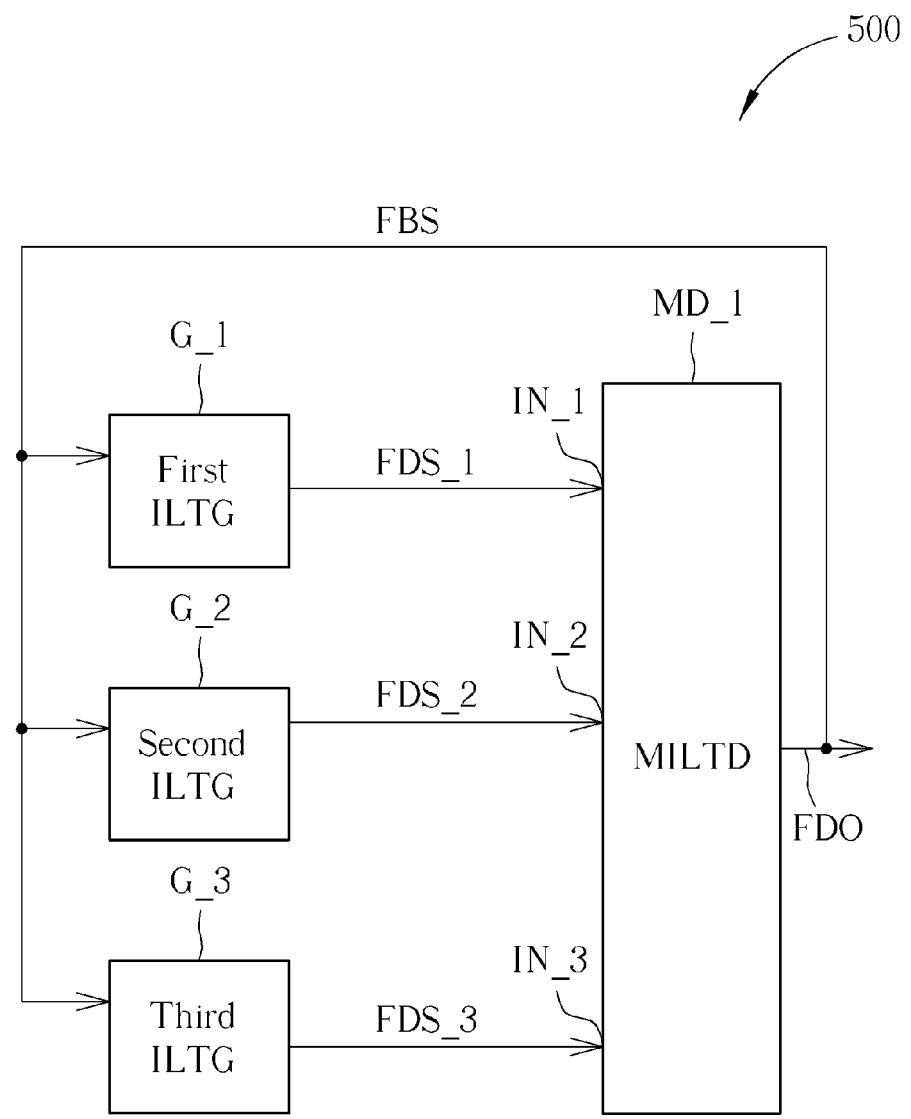
FIG. 5A, FIG. 5B, FIG. 6, FIG. 7A and FIG. 7B are block diagrams illustrating frequency dividing systems according to different embodiments of the present application.

FIG. 5A, FIG. 5B, FIG. 6, FIG. 7A and FIG. 7B are block diagrams illustrating frequency dividing systems according to different embodiments of the present application. Please note the clock terminals are not illustrated in the embodiments of FIG. 5A, FIG. 5B, FIG. 6, FIG. 7A and FIG. 7B for the convenience of explaining. In FIG. 5A, besides the first input level triggering group G_1 and the second input level triggering group G_2 a third input level triggering group G_3 is further included in the frequency dividing system 500. In such case, the first input level triggering group G_1, the second input level triggering group G_2, and the third input level triggering group G_3 can comprise input level triggering devices for different numbers.

Figure 5B:
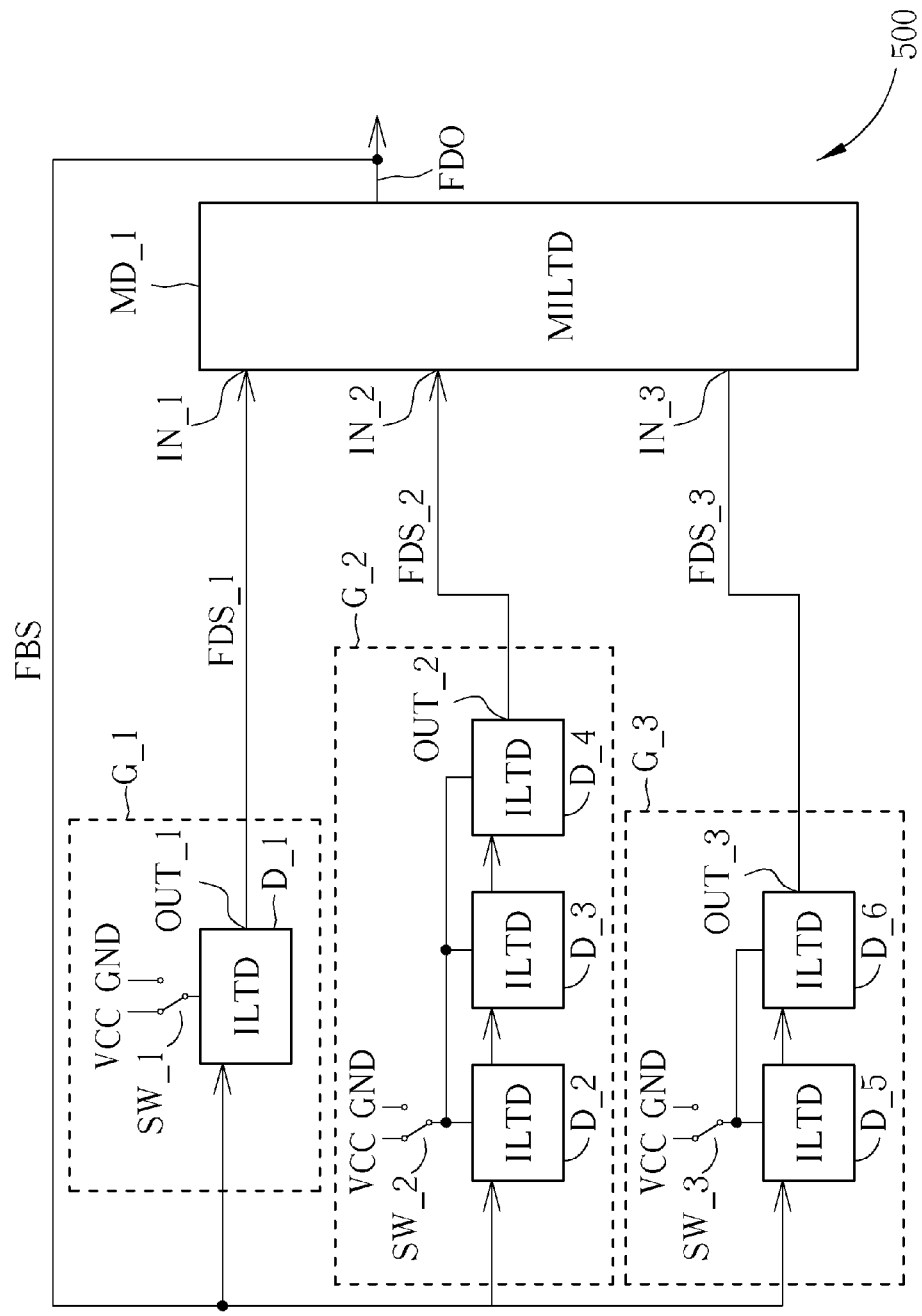

In FIG. 5B, The third input level triggering group G_3 comprises two input level triggering devices D_5, D_6, thus can cooperate with the first multiple input sharing input level triggering device MD_1 to have a different frequency dividing ratio from which of the first input level triggering group G_1 cooperating with the first multiple input sharing input level triggering device MD_1 and the second input level triggering group G_2 cooperating with the first multiple input sharing input level triggering device MD_1. In view of the embodiment in FIG. 5A and FIG. 5B, the frequency dividing system can comprise any number of input level triggering groups.

Figure 6:
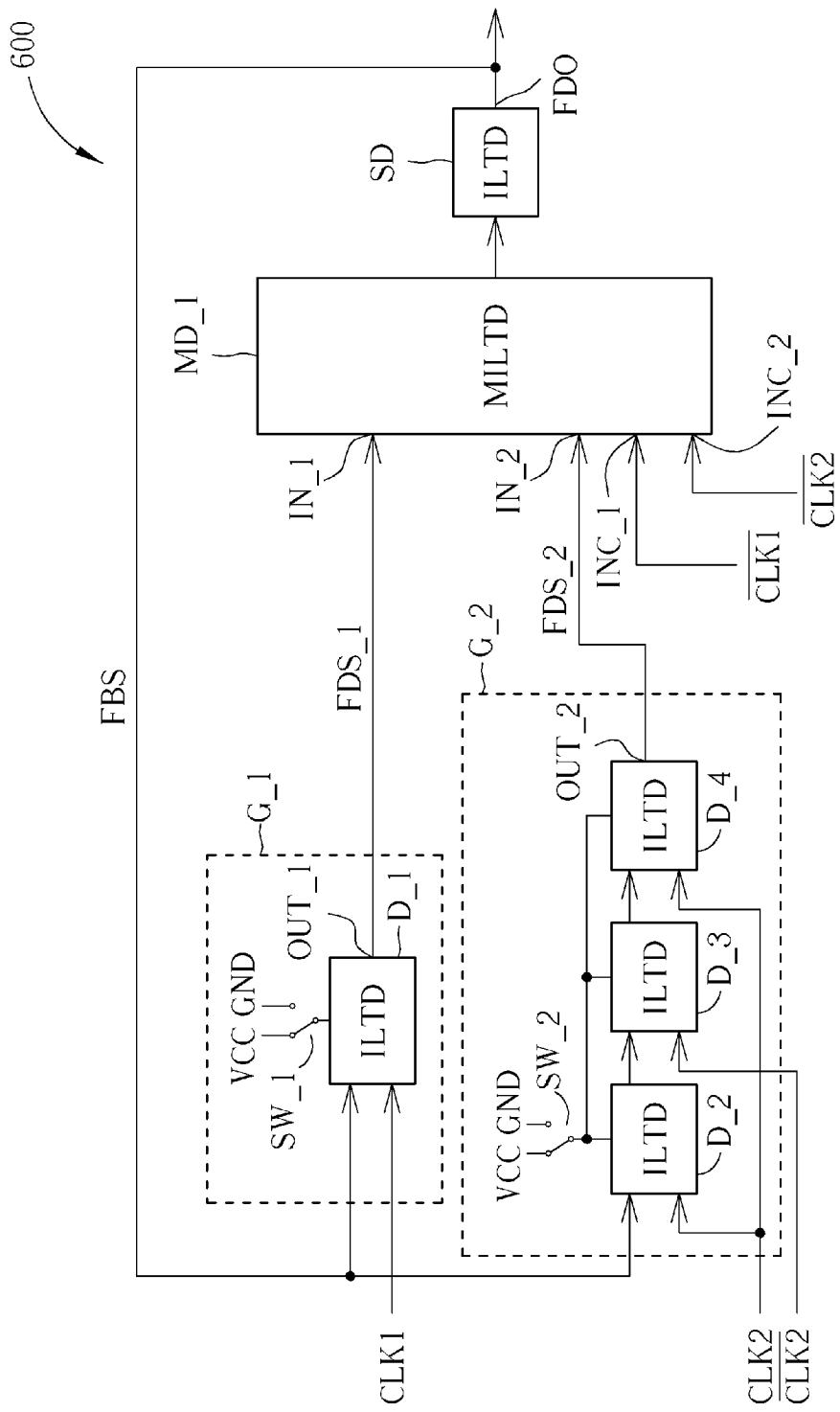

In the embodiment of FIG. 6, the frequency dividing system 600 comprises a first input level triggering group G_1 and a second input level triggering group G_2. As depicted in FIG. 6, besides the first multiple input sharing input level triggering device MD_1, the first input level triggering group G_1 and the second input level triggering group G_2 further respectively cooperates with a single input sharing input level triggering device SD to generate the feedback signal FBS. The single input sharing input level triggering device SD receives the output from the first multiple input sharing input level triggering device MD_1. Therefore, if the first input level triggering group G_1 is active and the second input level triggering group G_2 is not active, the first input level triggering group G_1 cooperates with the first multiple input sharing input level triggering device MD_1 and the single input sharing input level triggering device SD to generate the feedback signal FBS. On the contrary, if the second input level triggering group G_2 is active and the first input level triggering group G_1 is not active, the second input level triggering group G_2 cooperates with the first multiple input sharing input level triggering device MD_1 and the single input sharing input level triggering device SD to generate the feedback signal FBS. Please note the number for the single input sharing input level triggering device SD is not limited to one.

Also, in FIG. 6 the first input level triggering group G_1, the first multiple input sharing input level triggering device MD_1 and the single input sharing input level triggering device SD form a frequency dividing path having a frequency dividing ratio 3, and the second input level triggering group G_2, the first multiple input sharing input level triggering device MD_1 and the single input sharing input level triggering device SD form a frequency dividing path having a frequency dividing ratio 5.

Figure 7A:
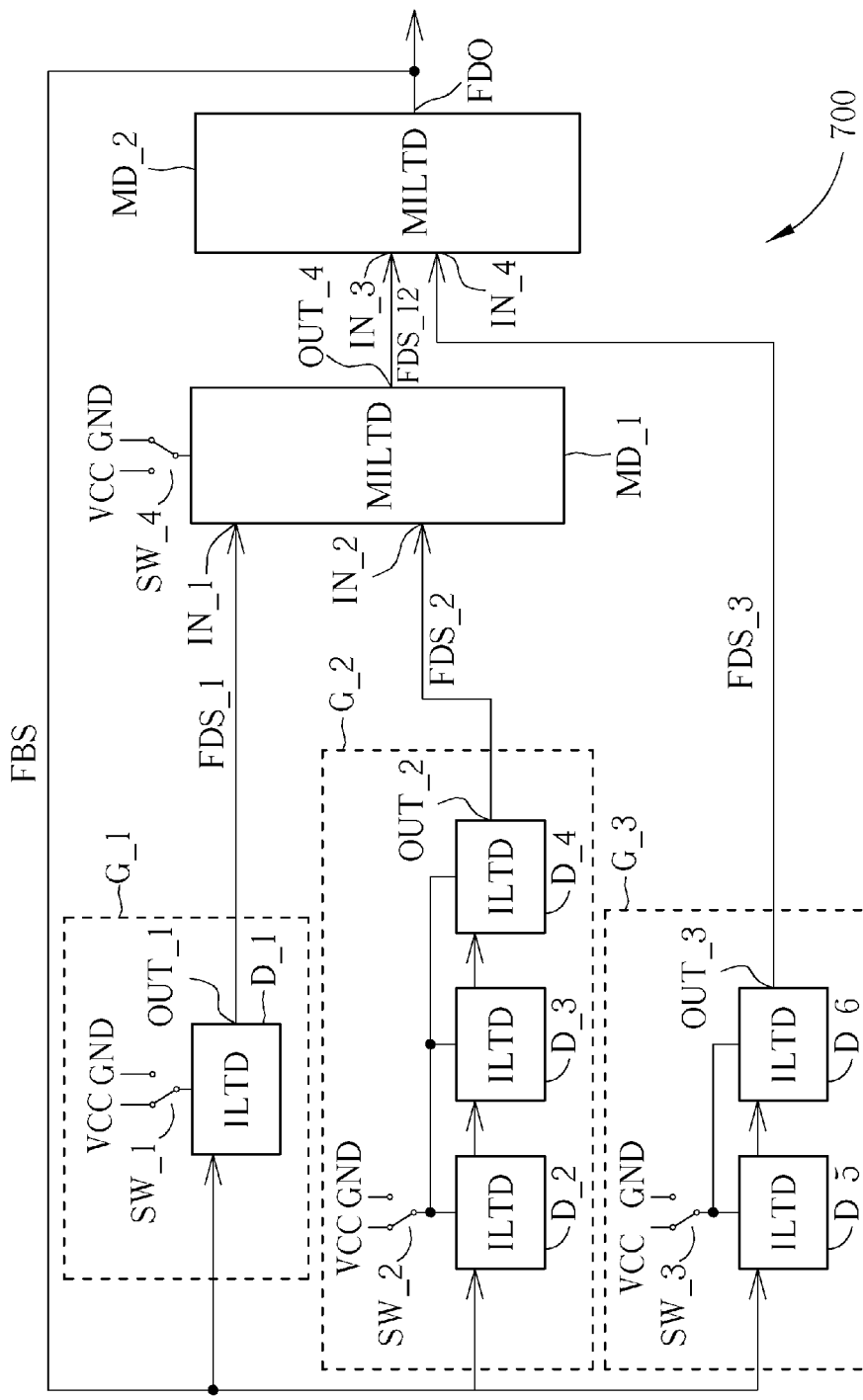

In the embodiment of FIG. 7A, the frequency dividing system 700 comprises a second multiple input sharing input level triggering device MD_2. The first multiple input sharing input level triggering device MD_1 comprises a first input terminal IN_1 coupled to the output terminals OUT_1 of the first input level triggering group G_1 and a second input terminal IN_2 coupled to the output terminal OUT_2 of the second input level triggering group G_2. The second multiple input sharing input level triggering device MD_2 comprises a third input terminal IN_3 coupled to the output terminal OUT_4 of the first multiple input sharing input level triggering device MD_1 and a fourth input terminal IN_4 coupled to the output terminal OUT_3 of the third input level triggering group G_3.

However, the arrangement depicted in FIG. 7A does not mean to limit the scope of the present application. The second multiple input sharing input level triggering device MD_2 can be summarized as: a second multiple input sharing input level triggering device, comprising a third input terminal (ex. IN_3) coupled to the output terminal of the first multiple input sharing input level triggering device MD_1, and a fourth terminal (ex. IN_4) coupled to an output terminal for a input level triggering group which does not output to the first multiple input sharing input level triggering device MD_1 (the third input level triggering group G_3 in this example).

The structure in FIG. 7A can be combined with the structure illustrated in above-mentioned embodiments. For example, the frequency dividing system 700 can comprise a third input level triggering group G_3, which comprises the structure illustrated in FIG. 5.

Also, in FIG. 7A the first input level triggering group G_1, the first multiple input sharing input level triggering device MD_1 and the second multiple input sharing input level triggering device MD_2 form a frequency dividing path having a frequency dividing ratio 3, and the second input level triggering group G_2, the first multiple input sharing input level triggering device MD_1 and the second multiple input sharing input level triggering device MD_2 form a frequency dividing path having a frequency dividing ratio 5. Additionally, the third input level triggering group G_3, the first multiple input sharing input level triggering device MD_1 and the second multiple input sharing input level triggering device MD_2 form a frequency dividing path having a frequency dividing ratio 3.

Figure 7B:
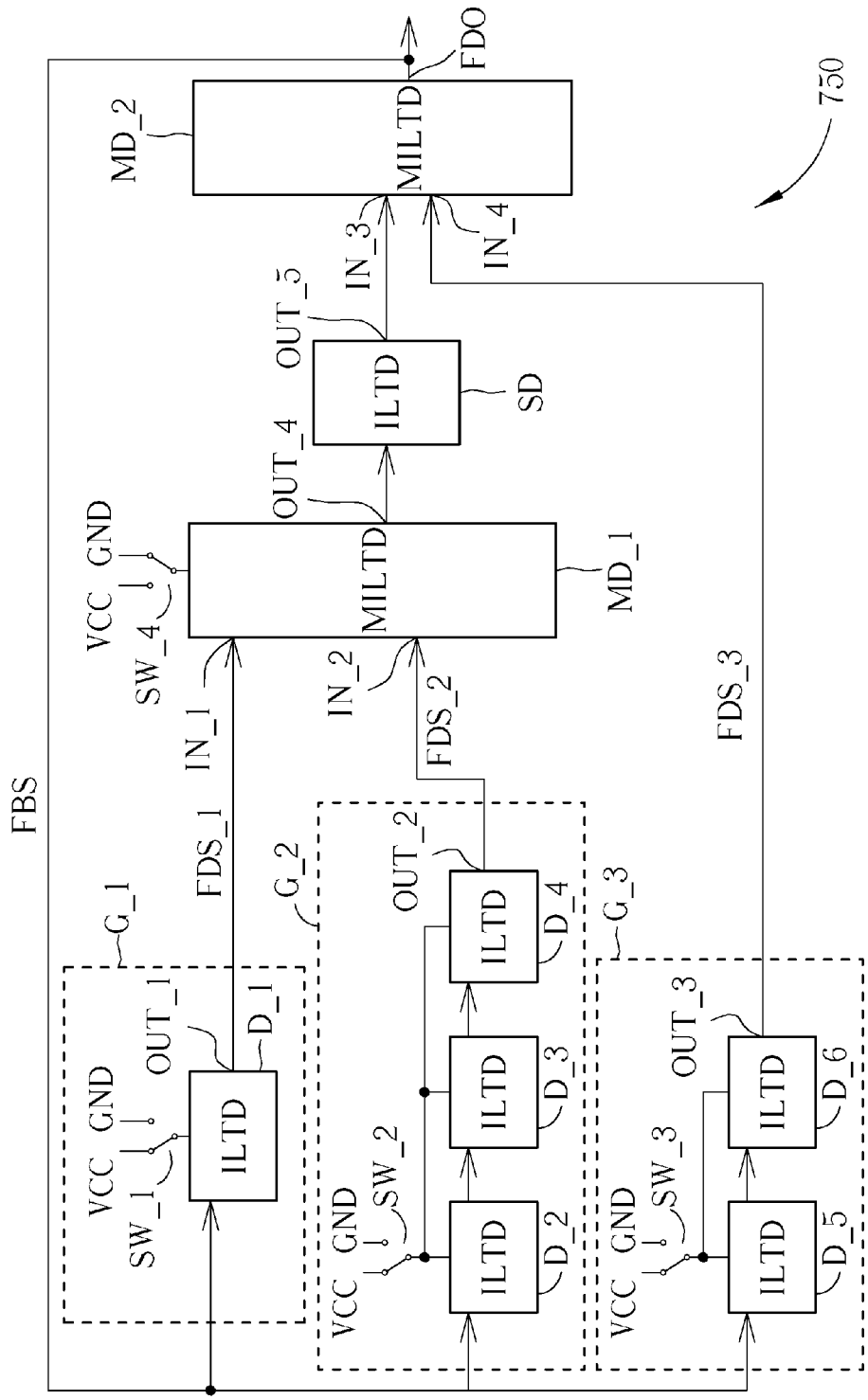

At least one single input sharing input level triggering device (ex. SD in FIG. 6) can be provided between the first multiple input sharing input level triggering device MD_1 and the second multiple input sharing input level triggering device MD_2 depicted in FIG. 7A. As shown in FIG. 7B, a single input sharing input level triggering device SD is provided between the first multiple input sharing input level triggering device MD_1 and the second multiple input sharing input level triggering device MD_2. However, the number for the single input sharing input level triggering device in FIG. 7B can be more than 1. Accordingly, the structure in FIG. 7B can be summarized as: The frequency dividing system of (ex. 750 in FIG. 7B) further comprises a single input sharing input level triggering device series provided between the first multiple input sharing input level triggering device and the second multiple input sharing input level triggering device. The single input sharing input level triggering device series comprises at least one single input sharing input level triggering device (In FIG. 7B, one single input sharing input level triggering device). The third input terminal (ex. IN_3) is coupled to an output terminal of the single input sharing input level triggering device series. An input terminal of the single input sharing input level triggering device series is coupled to an output terminal (ex. OUT_4) of the first multiple input sharing input level triggering device.

Figure 8:
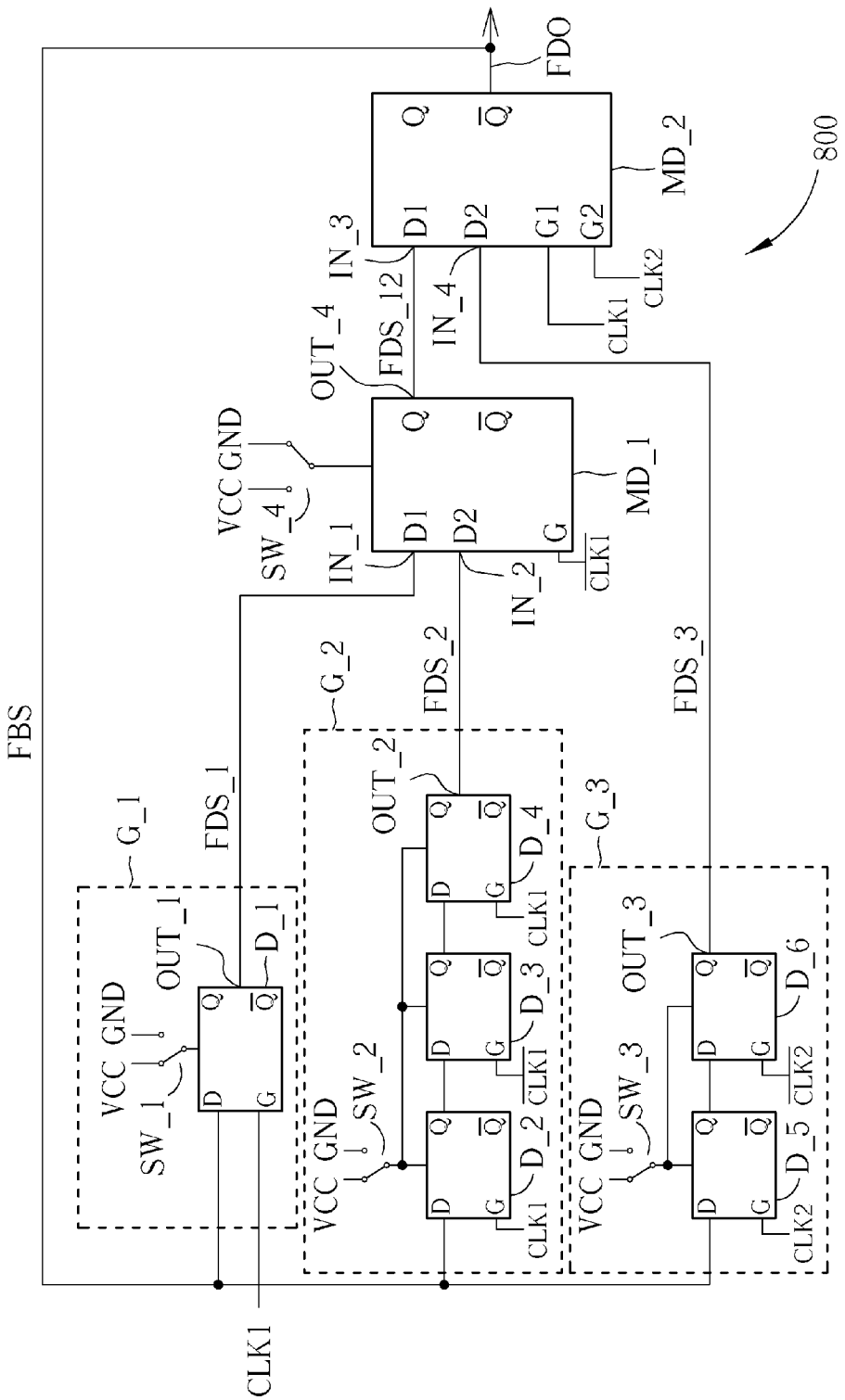
FIG. 8 is a more detail circuit diagram for the embodiment illustrated in FIG. 7A.

FIG. 8 is a more detail circuit diagram for the embodiment illustrated in FIG. 7A. As shown in FIG. 8, the first multiple input sharing input level triggering device MD_1 and the second multiple input sharing input level triggering device MD_2 both comprise multiple D terminals, and the input level triggering devices D_1-D_6 comprises a single D terminal. The input level triggering devices D_1-D_6 all comprise a D terminal to receive input from the second multiple input sharing input level triggering device MD_2 or a previous input level triggering device, and all comprise a Q terminal to output. In the embodiment of FIG. 8, the Q terminal of the input level triggering device D_1 is coupled to the first input terminal IN_1, the Q terminal of the input level triggering device D_4 is coupled to the second input terminal IN_2, and the Q terminal of the input level triggering device D_6 is coupled to the fourth input terminal IN_4.

Structures for other input level triggering devices are detailedly illustrated in FIG. 8 and the operations thereof have been illustrated in above-mentioned embodiments, thus the explanation thereof are omitted for brevity here. Additionally, the structures for above-mentioned embodiments can be combined. Such combination should also fall in the scope of the present application.

Please note the above-mentioned input level triggering group can further comprise at least one inverter. The location and numbers of the inverters can be changed corresponding to the numbers or the arrangement for the input level triggering devices.

FIG. 9 and FIG. 10 are circuit diagrams illustrating a detail structure for the multiple input sharing input level triggering device with multiple data inputs (i.e. MD_1 or MD_2). Please note in FIG. 9 and FIG. 10, the data signals and the clock signal (ex. CLK3, $\overline{CLK\_3}$) for a frequency dividing path comprising an odd number of input level triggering devices (ex. 1 input level triggering device, 3 input level triggering devices . . . ) are differential signals. However, the structures can also be amended to receive single ended data signals and single ended clock signals. Such variation should also fall in the scope of the present application. The multiple input sharing input level triggering device MD comprises a latch circuit LA, at least one receiving circuit (in this example, three receiving circuits R_1, R_2, R_3). Each receiving circuit comprises a pair of data receiving transistors (ex. T_5, T_6) and a pair of clock receiving transistors (ex. CR_1, CR_2). The data receiving transistors receive data signals such as FDS_1 or FDS_2 in FIG. 2 and fixed voltages from the first input level triggering group G1 or the second input level triggering group G2. The clock receiving transistors receive clock signals such as the clock signals CLK1, CLK2 in FIG. 2. Only one receiving circuit is active and others are non-active.

The operations for the receiving circuits will be described as below. Take the receiving circuit R_1 for example, in non-active mode for the input level triggering group, both IN_1 and $\overline{IN\_1}$ are low (i.e. fixed voltage) such that the receiving circuit R_1 is off and there is no action on LA. In active mode, IN_1 and $\overline{IN\_1}$ are differential signals (i.e. the first frequency dividing signal FDS_1 in FIG. 2) and the latch LA generate output at the Q terminal and the $\overline{Q}$ terminal according to a level of the clock signal received by the clock receiving transistors. In this example, the receiving circuits R_1, R_2 are applied to an even number of input level triggering devices and the receiving circuits R_3 is applied to a frequency dividing path with an odd number of input level triggering devices (ex. 1 input level triggering device, 3 input level triggering devices . . . ). The function for receiving circuits R_1, R_2 is defined in table T1 and the function for receiving circuit R_3 is defined in table T2.

In this embodiment, the latch LA comprises four transistors T_1-T_4. The receiving circuits R_1-R_3 all comprise four transistors, which are all NMOSFETs. For more detail, the receiving circuit R_1 comprises the data receiving transistors T_5, T_6 and the clock receiving transistors CR_1, CR_2, the receiving circuit R_2 comprises the data receiving transistors T_7, T_8 and the clock receiving transistors CR_3, CR_4, and the receiving circuit R_3 comprises the data receiving transistors T_9, T_10 and the clock receiving transistors CR_5, CR_6. The detail structure for the transistors are illustrated in FIG. 9, thus are omitted for brevity here.

In FIG. 9, the clock receiving transistors CR_1 and CR_2 can be merged to a single transistor, and the clock receiving transistors CR_3 and CR_4 can be merged to a single transistor. Additionally, if clock signals CLK1 and CLK2 have the same phase, clock receiving transistors can be merged.

Please note the circuit structure in FIG. 9 is only for example and does not mean to limit the scope of the present application. For example, the NMOSFETs in the receiving circuits can be replaced by PMOSFETs as illustrated in FIG. 10. In the embodiment of FIG. 10, the arrangement for the circuit is changed since the NMOSFETs in the receiving circuits can be replaced by PMOSFETs. The operation for FIG. 10 is similar with which of FIG. 9. Take the receiving circuit R_1 for example, in non-active mode, both IN_1 and $\overline{IN\_1}$ are high such that the receiving circuit R_1 is off and there is no action on LA. In active mode, IN_1 and $\overline{IN\_1}$ are differential signals. The function for receiving circuits R_1, R_2 is defined in table T1 and the function for receiving circuit R_3 is defined in table T2.

Other detail structures and operations of FIG. 10 can be acquired based on FIG. 9 and related description thereof, thus it is omitted for brevity here.

Also, please note the embodiments in FIG. 9 and FIG. 10 are not limited to differential signals. Therefore, structures for receiving circuits depicted in FIG. 9 and FIG. 10 can be summarized as: The first receiving circuit (ex. R_1) comprises: a first transistor, comprising a control terminal receiving the first frequency dividing signal, a first terminal coupled to an output terminal of the latch, and a second terminal; and a second transistor, comprising a control terminal receiving the first clock signal, a first terminal coupled to the second terminal of the first transistor, and a second terminal coupled to a predetermined voltage level. The second receiving circuit (ex. R_2) comprises: a third transistor, comprising a control terminal receiving the second frequency dividing signal, a first terminal coupled to the output terminal of the latch, and a second terminal; and a fourth transistor, comprising a control terminal receiving the second clock signal, a first terminal coupled to the second terminal of the third transistor, and a second terminal coupled to the predetermined voltage level.

Furthermore, the embodiments depicted in FIG. 9 and FIG. 10 are not limited to be applied to the above-mentioned embodiments, thus can be summarized as: A multiple input sharing input level triggering device, which comprises: a latching circuit; a first receiving circuit, for receiving a first input signal (ex. FDS_1) and a first clock signal (ex. CLK_1); a second receiving circuit, for receiving a second input signal (ex. FDS_2) and a second clock signal (ex. CLK_2). The latch circuit generates an output signal according to the first input signal and a level the first clock signal, or generates the output signal according to the second input signal and a level of the second clock signal.

In view of above-mentioned embodiments, the frequency dividing system can share at least one multiple input sharing input level triggering device and the multiple input sharing input level triggering device with multiple inputs can operate as a multiplexer. By this way, the multiplexer in related art can be omitted and the circuit region can be omitted.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency dividing system, comprising:
    a control circuit;
    a first multiple input sharing input level triggering device, comprising a first input terminal, a second input terminal, a first clock terminal and a second clock terminal, wherein the first multiple input sharing input level triggering device receives a first frequency dividing signal at the first input terminal to generate a feedback signal according to a level of a first clock signal received at the first clock terminal, or receives a second frequency dividing signal at the second input terminal to generate the feedback signal according to a level of a second clock signal received at the second clock terminal;
    a first input level triggering group, comprising at least one input level triggering device,
        for generating the first frequency dividing signal to the first multiple input sharing input level triggering device according to the feedback signal if the first input level triggering group is controlled by the control circuit to be active; and
        for outputting a fixed voltage to the first multiple input sharing input level triggering device if the first input level triggering group is controlled by the control circuit to be non-active; and
    a second input level triggering group, comprising at least one input level triggering device;
        for generating the second frequency dividing signal to the first multiple input sharing input level triggering device according to the feedback signal if the second input level triggering group is controlled by the control circuit to be active; and
        for outputting a fixed voltage to the first multiple input sharing input level triggering device if the second input level triggering group is controlled by the control circuit to be non-active;
    wherein the first input level triggering group cooperates with the first multiple input sharing input level triggering device to provide a first frequency dividing ratio, and the second input level triggering group cooperates with the first multiple input sharing input level triggering device to provide a second frequency dividing ratio.

2. The frequency dividing system of claim 1, wherein the first input level triggering group outputs the first frequency dividing signal via at least one output terminal for a single input level triggering device of the first input level triggering group if the first input level triggering group is active, and the first input level triggering group also outputs the fixed voltage via the output terminal if the first input level triggering group is non-active.

3. The frequency dividing system of claim 2, wherein the second input level triggering group outputs the second frequency dividing signal via at least one output terminal for a single input level triggering device of the second input level triggering group if the second input level triggering group is active, and the second input level triggering group also outputs the fixed voltage via the output terminal if the second input level triggering group is non-active.

4. The frequency dividing system of claim 1,
    wherein if the first input level triggering group is active and the second input level triggering group is non-active, the input level triggering devices in the first input level triggering group is controlled by the control circuit to couple to a first predetermined voltage level and the input level triggering devices in the second input level triggering group is controlled by the control circuit to couple to a second predetermined voltage level;
    wherein if the first input level triggering group is non-active and the second input level triggering group is active, the input level triggering devices in the first input level triggering group is controlled by the control circuit to couple to the second predetermined voltage level and the input level triggering devices in the second input level triggering group is controlled by the control circuit to couple to the first predetermined voltage level.

5. The frequency dividing system of claim 1, wherein the second input level triggering group comprises(:
    a first input level triggering device, comprising a D terminal for receiving the feedback signal; and
    a second input level triggering device, comprising a D terminal for receiving an output from a Q terminal of a previous D flip flop, and comprising a Q terminal for outputting the second frequency dividing signal.

6. The frequency dividing system of claim 5, wherein the previous input level triggering device is the first input level triggering device.

7. The frequency dividing system of claim 1, wherein the first input level triggering group comprises:
    a first input level triggering device, comprising a D terminal for receiving the feedback signal, and comprising a Q terminal for outputting the first frequency dividing signal.

8. The frequency dividing system of claim 1, further comprising:
    a single input sharing input level triggering device, comprising only one input terminal receiving an output from the first multiple input sharing input level triggering device, and comprising an output terminal for outputting the feedback signal.

9. The frequency dividing system of claim 1, further comprising:
    a third input level triggering group, comprising an input terminal receiving the feedback signal;
    a second multiple input sharing input level triggering device, comprising a third input terminal and a fourth input terminal, wherein the fourth input terminal is coupled to an output terminal of the third input level triggering group.

10. The frequency dividing system of claim 9, wherein the third input terminal is coupled to an output terminal of the first multiple input sharing input level triggering device.

11. The frequency dividing system of claim 9, further comprising a single input sharing input level triggering device series provided between the first multiple input sharing input level triggering device and the second multiple input sharing input level triggering device, wherein the single input sharing input level triggering device series comprises at least one single input sharing input level triggering device;

wherein the third input terminal is coupled to an output terminal of the single input sharing input level triggering device series, wherein an input terminal of the single input sharing input level triggering device series is coupled to an output terminal of the first multiple input sharing input level triggering device.

12. The frequency dividing system of claim 9, wherein the first input level triggering group cooperates with the first multiple input sharing input level triggering device and the second multiple input sharing input level triggering device to provide the first frequency dividing ratio;

wherein the second input level triggering group cooperates with the first multiple input sharing input level triggering device and the second multiple input sharing input level triggering device to provide the second frequency dividing ratio;

wherein the third input level triggering group cooperates with only the second multiple input sharing input level triggering device to provide a third frequency dividing ratio.

13. The frequency dividing system of claim 9, wherein the first input level triggering group comprises:

a first input level triggering device, comprising a D terminal coupled to an output terminal of the second multiple input sharing input level triggering device, and comprising a Q terminal coupled to the first input terminal.

14. The frequency dividing system of claim 9, wherein the third input level triggering group comprises:

a second input level triggering device, comprising a Q terminal coupled to the fourth input terminal.

15. The frequency dividing system of claim 1, wherein the first multiple input sharing input level triggering device comprises:

a latching circuit;

a first receiving circuit, for receiving the first frequency dividing signal and the first clock signal;

a second receiving circuit, for receiving the second frequency dividing signal and the second clock signal;

wherein the latch circuit generates the feedback signal according to the first frequency dividing signal and the level of the first clock signal, or generates the feedback signal according to the second frequency dividing signal and the level of the second clock signal.

16. The frequency dividing system of claim 15, wherein the first receiving circuit comprises:

a first transistor, comprising a control terminal receiving the first frequency dividing signal, a first terminal coupled to an output terminal of the latch, and a second terminal; and a second transistor, comprising a control terminal receiving the first clock signal, a first terminal coupled to the second terminal of the first transistor, and a second terminal coupled to a predetermined voltage level;

wherein the second receiving circuit comprises:

a third transistor, comprising a control terminal receiving the second frequency dividing signal, a first terminal coupled to the output terminal of the latch, and a second terminal; and a fourth transistor, comprising a control terminal receiving the second clock signal, a first terminal coupled to the second terminal of the third transistor, and a second terminal coupled to the predetermined voltage level.

17. The frequency dividing system of claim 15, wherein the first clock signal and the second clock signal have the same phase, wherein the second transistor and the fourth transistor are merged to a single transistor.

* * * * *